(12) United States Patent
Paul

(10) Patent No.: US 10,135,425 B1
(45) Date of Patent: Nov. 20, 2018

(54) POWER SAVING LATCHES

(71) Applicant: Marvell Israel (M.I.S.L) Ltd., Yokneam (IL)

(72) Inventor: Gideon Paul, Modiin (IL)

(73) Assignee: MARVELL ISRAEL (M.I.S.L.) LTD., Yokneam (IL)

(*) Notice: Subject to any disclaimer, the term of this patent is extended or adjusted under 35 U.S.C. 154(b) by 170 days.

(21) Appl. No.: 15/361,870

(22) Filed: Nov. 28, 2016

Related U.S. Application Data

(63) Continuation of application No. 14/566,387, filed on Dec. 10, 2014, now Pat. No. 9,509,285.

(60) Provisional application No. 61/914,130, filed on Dec. 10, 2013.

(51) Int. Cl.
*H03K 3/356* (2006.01)
*H03K 3/012* (2006.01)
*H03K 3/037* (2006.01)

(52) U.S. Cl.
CPC ............. *H03K 3/012* (2013.01); *H03K 3/037* (2013.01); *H03K 3/356104* (2013.01)

(58) Field of Classification Search
CPC ....... G06F 3/0688; G06F 1/3203; G11C 7/22; H01L 2924/00; H01L 2924/00014
See application file for complete search history.

(56) References Cited

U.S. PATENT DOCUMENTS

| 5,548,232 | A | 8/1996 | Yamaura |
| 8,339,170 | B1 | 12/2012 | Holzman |
| 8,593,194 | B2 | 11/2013 | Bazes |
| 2006/0245272 | A1 | 11/2006 | Hartono |
| 2007/0146032 | A1 | 6/2007 | Sedlak |
| 2012/0249181 | A1* | 10/2012 | Kanari ............ H03K 3/012 326/95 |

* cited by examiner

*Primary Examiner* — Sibin Chen

(57) ABSTRACT

Aspects of the disclosure provide a circuit having a pulse latch circuit and an enable circuit. The latch circuit is configured to receive a first signal at an input lead and drive the first signal to an output lead in response to an enable signal. The enable circuit is configured to be active to generate the enable signal to enable the latch circuit to receive the first signal when the first signal is different from a second signal on the output lead and is configured to default the enable signal to suppress the first signal so as not to be received at the latch circuit when the first signal is the same as the second signal.

20 Claims, 5 Drawing Sheets

POWER SAVING LATCHES

INCORPORATION BY REFERENCE

This application is a continuation of U.S. application Ser. No. 14/566,387, filed on Dec. 10, 2014, which claims the benefit of U.S. Provisional Application No. 61/914,130, "Compact Auto Gating FF" filed on Dec. 10, 2013. The disclosures of the applications referenced above are incorporated herein by reference in their entireties.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Flip-flops or latches are widely used in various integrated circuits (IC), such as sequential logic circuits, synchronous circuits, and the like. In an example, a processor is implemented using a pipeline architecture having a plurality of stages. Flip-flops are used throughout, and between, the pipeline stages to sample signals and perform various logic operations. The flip-flops are clocked to synchronize various logic operations, for example. The activities of the flip-flops consume a relatively large portion of the total logic power.

SUMMARY

Aspects of the disclosure provide a circuit having a latch circuit and an enable signal. The latch circuit is configured to receive a first signal at an input lead and drive the first signal to an output lead in response to an enable signal. The enable circuit is configured to be active to generate the enable signal to enable the latch circuit to receive the first signal when the first signal is different from a second signal on the output lead and configured to default the enable signal to suppress the first signal so as not to be received at the latch circuit when the first signal is the same as the second signal.

In an embodiment, the enable circuit is configured to be inactive when the first signal is the same as the second signal.

According to an aspect of the disclosure, the enable circuit is configured to compare the first signal and the second signal and to generate the enable signal in response to a pulsed clock signal when the first signal is different from the second signal. The enable circuit is disabled from generating the enable signal in response to the pulsed clock signal and the enable circuit is configured to default the enable signal to suppress the first signal so as not to be received at the latch circuit when the first signal is the same as the second signal.

In an embodiment, the enable circuit includes a cross-coupled differential pair configured with a pull-up or pull-down transistor to implement efficient XNOR function to compare the first signal and the second signal. In an example, the cross-coupled differential pair is not grounded. Further, the enable circuit includes a transistor coupled to a drain terminal of the cross-coupled differential pair to pull up/down a voltage of the drain terminal in response to the pulsed clock signal. In an example, the enable circuit includes a single transistor with gate-controlled by the pulsed clock signal.

Aspects of the disclosure provide a method that includes comparing a first signal received at an input lead of a latch circuit and a second signal at an output lead of the latch circuit that drives the first signal to the output lead in response to an enable signal, activating an enable circuit to generate the enable signal to enable the latch circuit to receive the first signal when the first signal is different from the second signal at the output lead of the latch circuit, and defaulting the enable signal to suppress the first signal so as not to be received at the latch circuit when the first signal is the same as the second signal.

Aspects of the disclosure provide an apparatus having an integrated circuit (IC) chip. The IC chip uses an auto gating latch circuit to reduce power consumption. The auto gating latch circuit includes a latch circuit and an enable circuit. The latch circuit is configured to receive a first signal at an input lead and drive the first signal to an output lead in response to an enable signal. The enable circuit is configured to be active to generate the enable signal to enable the latch circuit to receive the first signal when the first signal is different from a second signal on the output lead and configured to default the enable signal to suppress the first signal so as not to be received at the latch circuit when the first signal is the same as the second signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
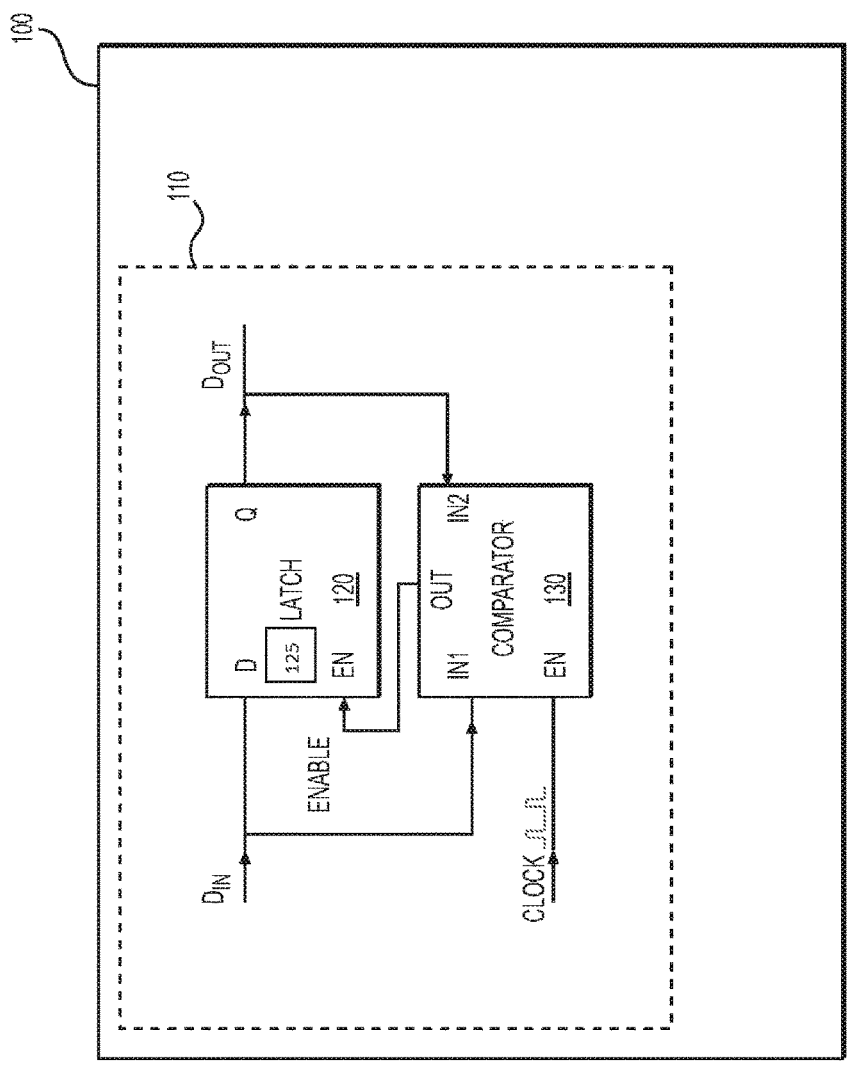
FIG. 1 shows a diagram of a circuit 100 according to an embodiment of the disclosure.

FIG. 1 shows a diagram of a circuit 100 according to an embodiment of the disclosure. The circuit 100 includes an auto gating latch 110. The auto gating latch 110 is gated according to a comparison of a first signal at an input lead and a second signal at an output lead of the auto gating latch 110 to save power by selectively suppressing a clock/enable signal data driving the latch as well as data to be latched when data to be input to the latch is the same as data output from the latch. In an example, when the first signal and the second signal are the same, power consuming activities, such as signal transitions, charging, discharging and the like, are disabled in the auto gating latch 110 to save power.

The circuit 100 can be any suitable circuit that uses one or more latches. In an embodiment, the circuit 100 is an integrated circuit (IC) chip, for example a system on a chip (SOC). The circuit 100 includes various circuit components, such as digital circuit, analog circuit, mixed signal circuit, and the like integrated on the IC chip. In an example, the circuit 100 includes a packet processor implemented as a pipeline architecture. In an example, packet processor includes a plurality of latches inserted in-between the pipeline stages to buffer signals between the stages. The latches are synchronized based on a clock signal, such as a system clock. In an example, the clock signal is a pulsed clock generated by a pulsed clock generator (not shown) that is separate from the auto gating latch 110 and potentially serves several latches. One or more of the latches are configured according to the auto gating latch 110 to save power. Thus, in an example, the circuit 100 is suitably used in a battery-powered device with a low power requirement, such as a smart phone, a tablet computer, and the like. In another embodiment, the circuit 100 is used in a high power consuming device, such as a network switch.

According to an aspect of the disclosure, the auto gating latch 110 includes a latch 120 and a comparator 130 coupled together as shown in FIG. 1. The latch 120 can be any suitable latch that can store data. The latch 120 has an input lead D configured to receive a data input $D_{IN}$, an output lead Q configured to generate a data output $D_{OUT}$ according to the stored data, and an enable lead EN configured to receive an enable signal ENABLE, in an embodiment.

In an example, the latch 120 drives the data input $D_{IN}$ received from the input lead D to the output lead Q according to the enable signal ENABLE. For example, when the enable signal ENABLE is binary "0", the latch 120 is disabled from storing data according to the data input $D_{IN}$. In an example, when the latch 120 is disabled, the data input $D_{IN}$ is suppressed from entering the latch 120, and the data output $D_{OUT}$ on the output lead Q is maintained regardless of the data input $D_{IN}$. For example, the latch 120 includes a data-in suppression circuit 125. In an example, the data-in suppression circuit 125 is a tri-state circuit and has a high impedance state in addition to binary "1" and "0" levels. When the enable signal ENABLE is binary "0", the data-in suppression circuit 125 is in the high impedance state to suppress the data input $D_{IN}$ entering the latch 120. When the enable signal ENABLE is binary "1", the latch 120 is enabled to store data according to the data input $D_{IN}$ and drive the data output $D_{OUT}$ on the output lead Q accordingly to the stored data, thus the data output $D_{OUT}$ on the output lead Q is the same as the data input $D_{IN}$.

In an embodiment, the comparator 130 compares the data input $D_{IN}$ on the input lead D and the data output $D_{OUT}$ on the output lead Q and generates the enable signal ENABLE based on the comparison. For example, when the data input $D_{IN}$ and the data output $D_{OUT}$ are the same, the comparator 130 outputs binary "0" as the enable signal ENABLE to disable the latch 120; and when the data input $D_{IN}$ and the data output $D_{OUT}$ are not the same, the comparator 130 outputs binary "1" as the enable signal ENABLE to enable the latch 120.

Further, in an embodiment, the comparator 130 receives a clock signal CLOCK, and when data input $D_{IN}$ and the data output $D_{OUT}$ are different, the comparator 130 provides the enable signal ENABLE in response to the clock signal CLOCK. In an embodiment, the CLOCK signal is a pulsed clock signal generated by a pulsed clock generator (not seen) such that the pulsed Clock signal is at one value for significantly less time than at another value. For example, the pulsed clock is high for significantly less time for than it is low, or vice versa.

According to an aspect of the disclosure, when the data input $D_{IN}$ and the data output $D_{OUT}$ are the same, the comparator 130 is gated (gate the clock path as well as the data input path) to disable signal transitions internal of the comparator 130 regardless of signal transitions in the clock signal CLOCK. In addition, the comparator 130 outputs binary "0" as the enable signal ENABLE to disable the latch 120 and to suppress receipt of data by the latch 120. In an example, when the latch 120 is disabled, signal transitions are disabled in the latch 120 and the $D_{IN}$ signal is suppressed. It is noted that the $D_{IN}$ is not inverted or buffered at the input to the latch circuit, such that when the $D_{IN}$ signal is suppressed, in an embodiment, it does not undergo inversions at the input to the latch circuit. Consequently, current due to operation of transistors, signal transitions and power due to capacitor charging/discharging are reduced or eliminated when the $D_{IN}$ signal is suppressed, and leakage is reduced due to minimal circuit topology (e.g., only 3 transistors for the comparator and clock).

The auto gating latch 110 can have various circuit implementations.

Figure 2:
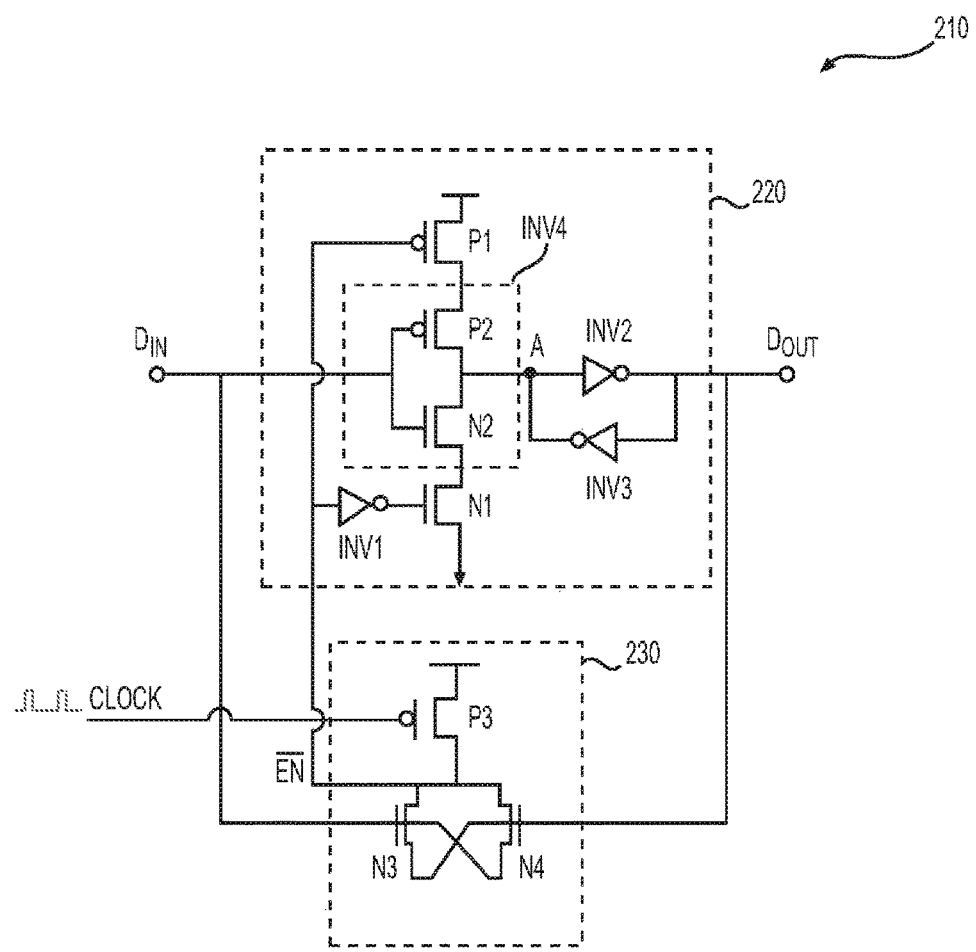
FIG. 2 shows a diagram of an auto gating latch 210 according to an embodiment of the disclosure.

FIG. 2 shows a circuit diagram of an auto gating latch 210 according to an embodiment of the disclosure. The auto gating latch 210 can be used in the circuit 100 as the auto gating latch 110. The auto gating latch 210 includes a D latch 220 and a comparator 230 coupled together as shown in FIG. 2. The auto gating latch 210 receives data input Dm and a clock signal CLOCK. In an example, the clock signal CLOCK is pulsed clock signal having a relatively small duty cycle, such as significantly less than 50%, and is generated by a pulsed clock generator (not seen). In an example, the auto gating latch 210 drives a data output $D_{OUT}$ to be the same as the data input $D_{IN}$ in response to a pulse in the clock signal CLOCK.

In the FIG. 2 example, the comparator 230 compares the data input $D_{IN}$ and the data output $D_{OUT}$. When the data input $D_{IN}$ and the data output $D_{OUT}$ are the same, the comparator 230 generates an enable signal EN to suppress the data input $D_{IN}$ entering the D latch 220 and disable the D latch 220 from signal transitions. In addition, the comparator 230 disables internal signal transitions of the comparator 230 regardless of transitions in the clock signal CLOCK.

Specifically, the comparator 230 includes a P-type metal-oxide-semiconductor (MOS) transistor P3 and N-type MOS transistors N3 and N4 coupled together as shown in FIG. 2. The P-type MOS transistor P3 is gate-controlled by the clock signal CLOCK to pull up the enable signal $\overline{EN}$. The N-type MOS transistors N3 and N4 form a cross-couple differential pair. The cross-coupled differential pair is coupled with the transistor P3 to implement an XNOR function to compare the data input $D_{IN}$ with the data output $D_{OUT}$. In the FIG. 2 example, the comparator 230 is not grounded.

In the FIG. 2 example, the D latch 220 is implemented using a compact D latch design that includes N-type MOS transistors N1 and N2, P-type MOS transistors P1 and P2, and inverters INV1-INV3. The transistors N2 and P2 are coupled together to form an inverter INV4 and the transistors N1 and P1 are coupled to the transistors N2 and P2 to gate the inverter INV4 according to the enable signal $\overline{EN}$. The transistors P1-P2 and N1-N2 form a data-in suppression circuit that suppresses the data input $D_{IN}$ to enter the D latch 220 in response to the enable signal $\overline{EN}$. For example, when the enable signal $\overline{EN}$ is low, the inverter INV4 is enabled to take the data input $D_{IN}$ and drive an inversion of the data input $D_{IN}$ at node A. When the enable signal $\overline{EN}$ is high, the inverter INV4 is disabled from driving the node A according to the data input $D_{IN}$, and the inverter INV4 is in a high impedance state to suppress the data input $D_{IN}$ to enter the D latch 220. The inverters INV2 and INV3 form a feedback loop coupled to the node A to buffer the data at the node A and drive the data output $D_{OUT}$ accordingly.

During operation, in an example, when the data input $D_{IN}$ and the data output $D_{OUT}$ have the same binary value, both of the N-type MOS transistors N3 and N4 are turned off, and the enable signal $\overline{EN}$ is held high due to the pull up by the P-type MOS transistor P3. In addition, nodes in the comparator 230 stay at the same logic values without transitions regardless of pulse transitions in the clock signal CLOCK. Because the enable signal $\overline{EN}$ is held high, the inverter INV4 is disabled, and the inverters INV2 and INV3 maintain the state of the node A and the data output $D_{OUT}$. Thus, when the data input $D_{IN}$ and the data output $D_{OUT}$ have the same binary value, the auto gating latch 210 does not exhibit signal transitions.

However, when the data input $D_{IN}$ and the data output $D_{OUT}$ have different binary values, one of the N-type MOS transistors N3 or N4 is turned on. When the clock signal CLOCK transits from low to high, the P-type MOS transistor P3 is turned off and thus the enable signal $\overline{EN}$ is pulled down by one of N3 or N4 that is turned on, and the inverter INV4 is enabled to drive the node A to be the inversion of the data input $D_{IN}$ and thereby enable the data input $D_{IN}$ to be provided to node A. Then, the inverter INV2 drives the data output $D_{OUT}$ accordingly, thus the data output $D_{OUT}$ is the same as the data input $D_{IN}$. The change of the data output $D_{OUT}$ then turns off both of the N-type MOS transistors N3 and N4. The enable signal $\overline{EN}$ is subsequently pulled up to return inverter INV4 to a disabled state in which the data input $D_{IN}$ is suppressed and not passed to node A.

In the FIG. 2 example, the auto gating latch 210 has a reduced number of signal transitions and saves power. Further, in an embodiment, the auto gating latch 210 is implemented using a compact design with thirteen transistors (each inverter is implemented using an N-type MOS transistor and a P-type MOS transistor) which is less than a general latch design normally with sixteen or more transistors. Thus, the implementation of the auto gating latch 210 saves power as well as silicon area. In addition, in the FIG. 2 example, the clock signal CLOCK drives a single transistor (e.g., transistor P3) per latch according to the implementation of the auto gating latch 210. Thus, in an embodiment, the load capacitance of the clock signal CLOCK is about ¼ of a general latch design in which the clock signal normally drives four transistors per latch. Because power consumption in a clock distribution system is proportional to the load, the auto gating latch 210 can be implemented to reduce power consumption in the clock distribution system. Also, in the FIG. 2 example, because data glitches in the input signal $D_{IN}$ are gated, the implementation of the auto gating latch 210 saves power wasted due to data glitches and has the benefit of filtering out glitches in the input signal $D_{IN}$.

According to an aspect of the disclosure, as a pulsed latch, the auto gating latch 210 behaves substantially equivalently to a general D flip-flop and can be integrated into a chip design or a register transfer level (RTL) model with relative ease.

Figure 3:
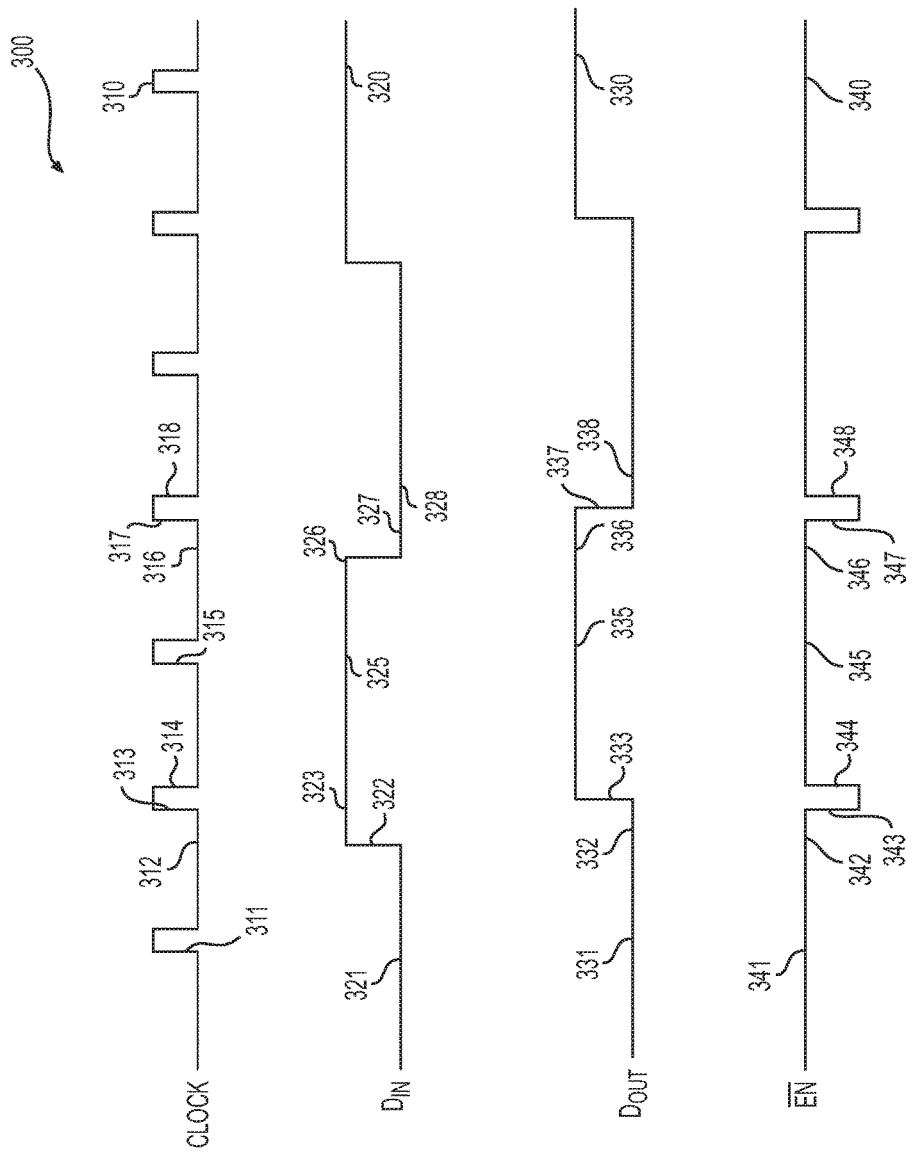
FIG. 3 shows a plot 300 of waveforms according to an embodiment of the disclosure.

FIG. 3 shows a plot 300 of waveforms for signals in the FIG. 2 example according to an embodiment of the disclosure. The plot 300 includes a first waveform 310 for the clock signal CLOCK, a second waveform 320 for the data input $D_{IN}$, a third waveform 330 for the data output $D_{OUT}$, and a fourth waveform 340 for the enable signal $\overline{EN}$.

When the data input $D_{IN}$ and the data output $D_{OUT}$ have the same binary value, for example as shown by 321 and 331, the enable signal $\overline{EN}$ is held high as shown by 341 to disable signal transitions in the latch 220 regardless of pulse transitions in the clock signal CLOCK as shown by 311.

When the data input $D_{IN}$ and the data output $D_{OUT}$ have different binary values, for example as shown by 322 and 332, one of the N-type MOS transistors N3 and N4, such as N3, is turned on, and the other one, such as N4, is turned off.

When the clock signal CLOCK transits from low to high, such as shown by 313, the P-type MOS transistor P3 is turned off, and the enable signal $\overline{EN}$ is pulled down such as shown by 343, and the latch 220 is enabled to buffer data according to the data input $D_{IN}$ and drive the data output $D_{OUT}$ accordingly, such as shown by 333, thus the data output $D_{OUT}$ is the same as the data input $D_{IN}$. The change of the data output $D_{OUT}$ then turns off both of the N-type MOS transistors N3 and N4. Then in response a falling edge of the clock signal CLOCK, as shown by 314, the P-type MOS transistor P3 is turned on, and the enable signal $\overline{EN}$ is subsequently pulled up, as shown by 344, to disable the inverter INV4.

Figure 4:
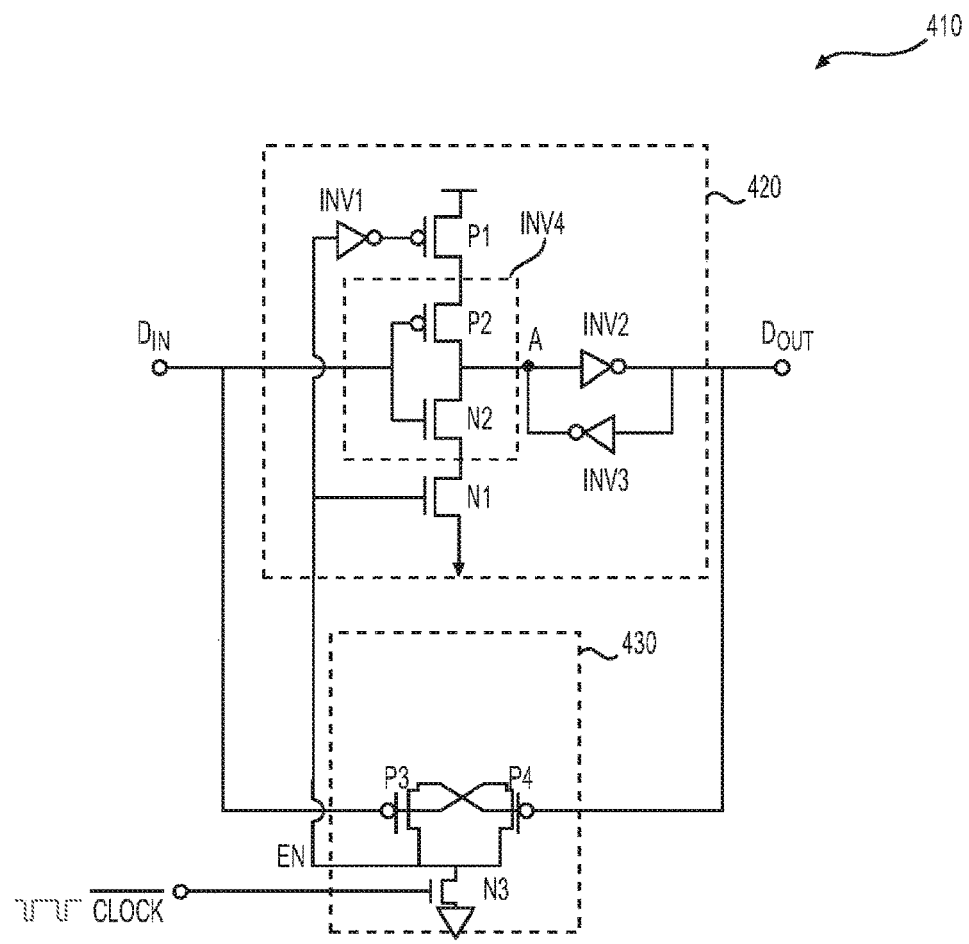
FIG. 4 shows a diagram of another auto gating latch 410 according to an embodiment of the disclosure.

FIG. 4 shows a circuit diagram of another auto gating latch 410 according to an embodiment of the disclosure. The auto gating latch 410 operates similarly to the auto gating latch 210 described above. The auto gating latch 410 also utilizes certain components that are identical or equivalent to those used in the auto gating latch 210, the description of these components has been provided above and will be omitted here for clarity purposes.

However, the comparator 430 includes P-type MOS transistors P3 and P4 and N-type MOS transistor N3 coupled together. The N-type MOS transistor N3 is gate-controlled by the clock signal $\overline{CLOCK}$ to pull down the enable signal EN. The P-type MOS transistors P3 and P4 form a cross-couple differential pair that implements with N3 an XNOR function to compare the data input $D_{IN}$ with the data output $D_{OUT}$ and pull up the enable signal EN when the data input $D_{IN}$ and the data output $D_{OUT}$ are not the same.

In the FIG. 4 example, the D latch 420 is enabled/disabled according to the enable signal EN. When the enable signal EN is high, the D latch 420 is enabled to buffer data according to the data input $D_{IN}$ and drive the data output $D_{OUT}$ according to the buffered data. When the enable signal EN is low, the D latch 420 is disabled from storing data according to the data input $D_{IN}$. For example, the inverter INV4 is disabled to have the high impedance state to suppress the data input $D_{IN}$ entering the D latch 420.

It is noted that the auto gating latch 210 and 410 can be suitably modified to use other suitable latch circuit and comparator circuit. In an example, a static random access memory (SRAM) based latch is used in the place of the latch 220 or the latch 420. In another example, the comparator 230 or 430 is implemented using a standard pulse latch design that blocks the internal clock first buffer (inverter) to generate a clock pulse only when the data input $D_{IN}$ is different from the data output $D_{OUT}$.

Figure 5:
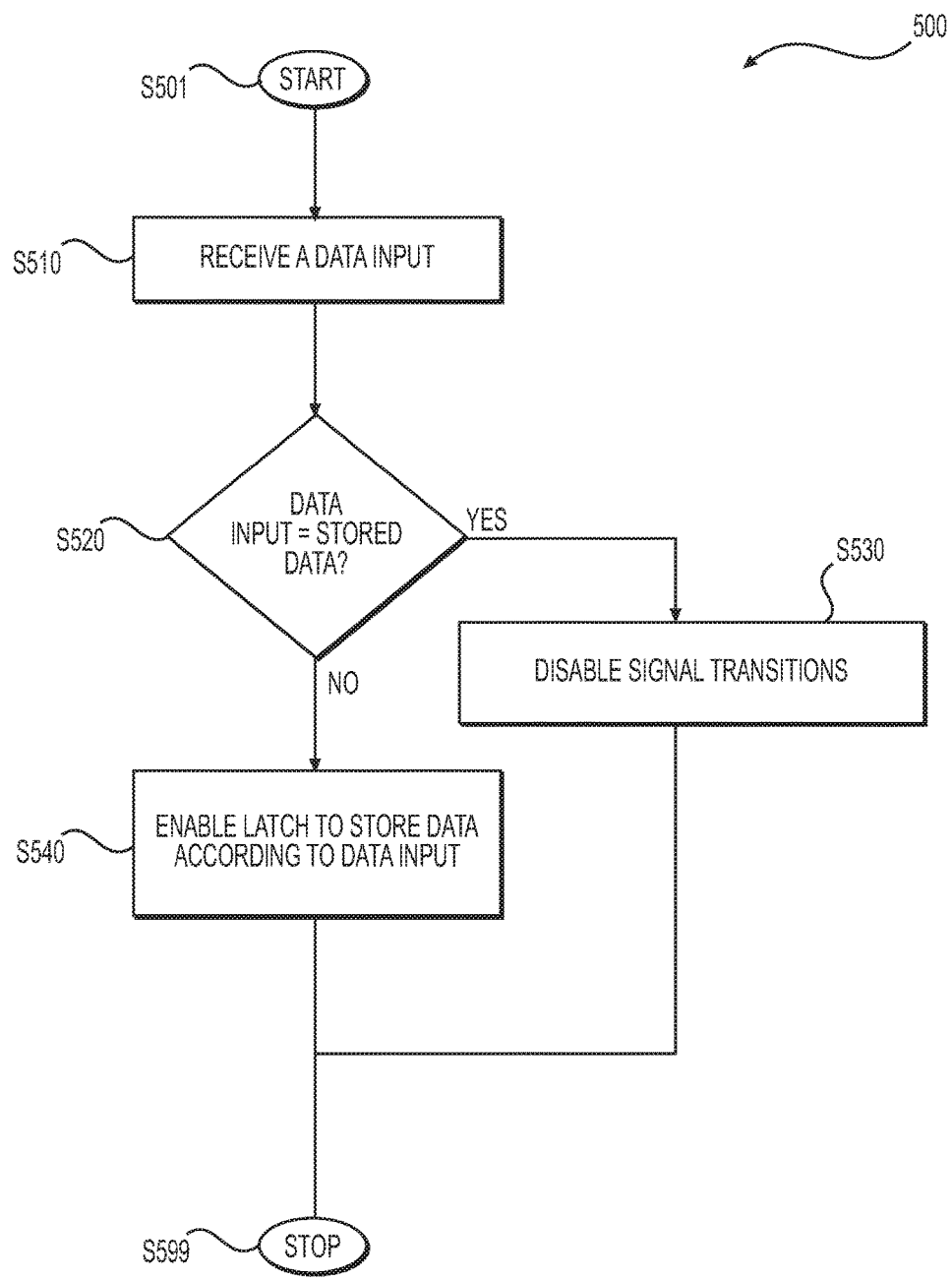
FIG. 5 shows a flow chart outlining a process 400 according to an embodiment of the disclosure.

FIG. 5 shows a flow chart outlining a process example 500 according to an embodiment of the disclosure. In the FIG. 2 example, the process 500 is executed by the auto gating latch 210. The process starts at S501 and proceeds to S510.

At S510, a data input is received at a latch. In the FIG. 2 example, the latch 220 receives the data input DN.

At S520, the data input is compared with stored data in the latch. In the FIG. 2 example, the comparator 230 compares the data input $D_{IN}$ with the data output $D_{OUT}$ which corresponds to the stored data in latch 220. When the data input $D_{IN}$ is equal to the data output $D_{OUT}$, the process proceeds to S530; otherwise the process proceeds to S540.

At S530, signal transitions are suppressed. In the FIG. 2 example, when the data input and the data output are the same, signal transitions in the comparator 230 are suppressed regardless of transitions in the clock signal CLOCK. In addition, the comparator 230 defaults the enable signal $\overline{EN}$ to be logic "1" to disable the latch 220. For example, the inverter INV4 is in the high impedance state to suppress the data input $D_{IN}$ entering the latch 220. Thus, latch 220 does not have signal transitions. Then, the process proceeds to S599 and terminates.

At S540, an enable signal is set to enable the latch to store data according to the data input. In the FIG. 2 example, when the data input is different from the data output, one of the transistors N3 and N4 is turned on. Further, in response to a rising edge of a pulse of the clock signal CLOCK, the transistor P3 is turned off, and thus the enable signal $\overline{EN}$ is pulled down to be logic "0". Then the latch 220 is enabled to store data according to the data input. Accordingly, the data output is equal to the data input, and the comparator 230 turns off both the transistors N3 and N4. Subsequently, the enable signal $\overline{EN}$ is pulled up. Then, the process proceeds to S599 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
    a latch circuit configured to receive a first signal and selectively drive the first signal to an output lead in response to an enable signal; and
    an enable circuit including a comparator and a transistor, the transistor having a gate terminal and configured to control an output of the comparator based on a clock signal received at the gate terminal of the enable circuit transistor, the enable circuit configured to output the enable signal to enable the latch circuit to receive the first signal based on the clock signal received only when the first signal is different from a second signal on the output lead.

2. The circuit of claim 1, wherein the enable circuit is further configured to transition to a rising edge of the enable signal in sync with a transition of the clock signal to enable the latch circuit to receive the first signal when the first signal is different from the second signal.

3. The circuit of claim 2, wherein the enable circuit is further configured to transition to a falling edge of the enable signal in sync with another transition of the clock signal to suppress the first signal so as not to be received at the latch circuit when the first signal is the same as the second signal.

4. The circuit of claim 1, wherein the enable circuit is configured to be inactive when the first signal is the same as the second signal.

5. The circuit of claim 4, wherein the enable circuit is disabled from generating the enable signal in response to the clock signal and the enable circuit is further configured to default the enable signal to suppress the first signal so as not to be received at the latch circuit when the first signal is the same as the second signal.

6. The circuit of claim 1, wherein the comparator is configured to compare the first signal and the second signal and to generate the enable signal in response to the clock signal when the first signal is different from the second signal.

7. The circuit of claim 1, wherein the enable circuit further comprises:
    a cross-coupled differential pair configured with a clock pull-up or pull-down transistor to implement an XNOR function to compare the first signal and the second signal.

8. The circuit of claim 7, wherein the XNOR function performs the comparison between the first signal and the second signal using the cross-coupled differential pair that is not grounded.

9. The circuit of claim 7, wherein the transistor is coupled to a drain terminal of the cross-coupled differential pair to pull up/down a voltage of the drain terminal in response to the clock signal.

10. The circuit of claim 7, wherein the transistor is coupled between the cross-coupled differential pair and a power supply.

11. A method, comprising:
    receiving, by a latch circuit, a first signal and selectively driving the first signal to an output lead in response to an enable signal;
    controlling, by a transistor, an output of a comparator based on a clock signal received only at a gate terminal of the transistor; and
    generating, by an enable circuit including the transistor and comparator, the enable signal to enable the latch circuit to receive the first signal based on the clock signal received only when the first signal is different from a second signal on the output lead.

12. The method of claim 11, further comprising:
    transitioning to a rising edge of the enable signal in sync with a transition of the clock signal to enable the latch circuit to receive the first signal when the first signal is different from the second signal.

13. The method of claim 12, further comprising:
    transitioning to a falling edge of the enable signal in sync with another transition of the clock signal to suppress the first signal so as not to be received at the latch circuit when the first signal is the same as the second signal.

14. The method of claim 11, further comprising:
    deactivating the enable circuit when the first signal is the same as the second signal.

15. The method of claim 14, wherein deactivating the enable circuit further comprises:
    disabling the enable circuit from generating the enable signal in response to the clock signal and defaulting the enable signal to suppress the first signal so as not to be received at the latch circuit when the first signal is the same as the second signal.

16. The method of claim 11, further comprising:
    comparing, by the comparator, the first signal and the second signal; and
    generating the enable signal in response to the clock signal when the first signal is different from the second signal.

17. The method of claim 11, further comprising:
    performing an XNOR function to compare the first signal and the second signal by a cross-coupled differential pair configured with a clock pull-up or pull-down transistor.

18. The method of claim 17, wherein performing the XNOR function further comprises:
    comparing the first signal and the second signal by the cross-coupled differential pair that is not grounded.

19. The circuit of claim 17, further comprising:
    in response to the clock signal, pulling up/down a voltage of a drain terminal of the cross-coupled differential pair that is coupled with the transistor.

20. The circuit of claim 17, wherein performing the XNOR function further comprises:
  switching the transistor coupled between the cross-coupled differential pair and a power supply.

* * * * *